United States Patent [19]

Jackson et al.

[11] Patent Number: 4,532,533
[45] Date of Patent: Jul. 30, 1985

[54] BALLISTIC CONDUCTION SEMICONDUCTOR DEVICE

[75] Inventors: Thomas N. Jackson, Ossining; Jerry M. Woodall, Bedford Hills, both of N.Y.

[73] Assignee: International Business Machines Corporation, Armonk, N.Y.

[21] Appl. No.: 372,359

[22] Filed: Apr. 27, 1982

[51] Int. Cl.$^3$ .................... H01L 29/34; H01L 29/205
[52] U.S. Cl. ......................................... 357/16; 357/4; 357/15; 357/61; 357/34
[58] Field of Search .................... 357/4, 16, 61, 15, 34

[56] References Cited

U.S. PATENT DOCUMENTS

| | | | |
|---|---|---|---|
| 3,209,215 | 9/1965 | Esaki | 317/234 |
| 3,289,052 | 11/1966 | Mead | 357/16 |
| 3,349,297 | 10/1967 | Crowell et al. | 317/234 |
| 3,486,949 | 12/1969 | Rediker et al. | 148/33.4 |
| 4,163,237 | 7/1979 | Dingle et al. | 357/16 |
| 4,286,275 | 8/1981 | Heiblum | 357/16 |
| 4,326,208 | 4/1982 | Fang et al. | 357/16 |
| 4,366,493 | 12/1982 | Braslau et al. | 357/4 |
| 4,395,722 | 7/1983 | Esaki et al. | 357/16 |
| 4,424,525 | 1/1984 | Mimura | 357/16 |

OTHER PUBLICATIONS

J. Electrochem. Soc.: Solid State Science, 118, No. 2, pp. 355-358, Feb. 1971, "GaAs-GaAsP Heterostructure Injection Lasers" by M. G. Craford et al.
IBM Journal, vol. 4, No. 3, pp. 283-287, Jul. 1960, "Germanium-Gallium Arsenide Heterojunctions" by R. L. Anderson.
IRE-AIEE, Solid State Device Research Conf., Nov. 1962, Atalla et al., p. 507.
Proceedings of the IRE, Jun. 1962, pp. 1527-1528, D. V. Geppert.
Physics of Thin Films, Academic Press, N.Y. p. 325, (1967), Crowel et al.

Primary Examiner—William D. Larkins
Assistant Examiner—Charles S. Small, Jr.
Attorney, Agent, or Firm—Alvin J. Riddles

[57] ABSTRACT

A ballistic conduction majority carrier type semiconductor device structure can be fabricated with a built-in difference in barrier height between the emitter and collector interfaces by employing surface fermi level pinning in a crystalline structure with three copolanar regions of different semiconductor materials. The center region between the interfaces with the external zones of the structure has a thickness of the order of the mean free path of an electron. The materials of the external regions are such that there is a mismatch between the crystal spacing of the external regions and the central region which causes the fermi level of the material in the central zone to be pinned in the region of the conduction band at the interfaces with the external regions and the material of the external regions is selected so that the surface fermi level is pinned in the forbidden region. A monocrystalline structure having an emitter region of GaAs, a central or base region of InAs or W 100 Å to 500 Å thick, and a collector region of GaInAs provides switching in the range of $10^{-12}$ seconds.

4 Claims, 5 Drawing Figures

BALLISTIC CONDUCTION SEMICONDUCTOR DEVICE

DESCRIPTION

1. Technical Field

The technical field of the invention is that of high switching speed semiconductor devices.

2. Background Art

One type of semiconductor device that exhibits extremely high speed employs the principle of ballistic or hot electron type of transport rather than the previously employed principles of drift and diffusion for carrier transport across the base region. In this type of conduction, the carriers move across the base region from the emitter to the collector barrier with a reduced probability of energy loss. Devices employing this principle generally have a base type region where the conduction takes place that has a dimension of the order of the mean free path of a carrier in the semiconductor material and generally employ majority carriers for signal conversion.

An early model of a ballistic or hot electron type of transistor involved the use of a metal as the base region and was described by an article by M. M. Atalla et al, in the IRE-AIEE Solid State Device Research Conference in July 1962. Problems were encountered in the early metal-base structures in that the evaporated metal that served as the base had processing difficulties that produced lower quality devices than were desirable. An improvement in the art was made employing a special semiconductor base. This structure, described in U.S. Pat. No. 3,209,215, relied upon a difference in crystallographic orientation of the external zones to produce a difference between the emitter to base barrier height and the collector to base barrier height.

Not always are the materials and processing conditions, however, sufficiently flexible that differences in crystallographic orientation may be employed.

DISCLOSURE OF THE INVENTION

In accordance with the invention, an improved ballistic transport type of semiconductor device is produced by providing three essentially coplanar regions of semiconductor materials for majority carrier transport so selected that the fermi level of the center region is pinned in the conduction band at the interface with the external regions where the fermi level is pinned in the forbidden region, that the barrier between the center region and one external region is higher than between the center region and the other external region and the distance across the center region is of the order of the mean free path length of an electron.

The structure of the invention will provide a base that has very high conductivity. There will be, through the use of different semiconductors for the emitter and collector external regions, a built-in difference in emitter to base and collector to base barriers thereby requiring very small external bias when the device is used in a circuit.

The structure is made of regions of different semiconductors having different energy gaps at each interface thereby providing heterojunction barriers.

The use of heterojunction barriers in devices is described in J. Electrochem. Soc. 118, No. 2, p. 355-358, February 1971, however, the lattice mismatch at the barrier produced states that affected performance of a minority carrier type device.

In accordance with the invention, a majority carrier device is constructed so that the charges related to the mismatches have minimal effect on this type of carrier transport. The phenomenon of surface fermi level pinning usually considered detrimental is employed as a beneficial structural element. The different energy gaps and fermi level conditions at the surfaces are chosen such that two general conditions are provided. First, the material of the base region has the surface fermi level pinned in the conduction band whereas the surface fermi level of the external regions are pinned in the forbidden region and, second, the materials are selected so that the barrier at the interface between the base and one external region is larger than the barrier at the interface between the base and the other external region.

In some multiple ingredient semiconductors such as GaAs, it has been found that surface conditions produce a condition where the fermi level is pinned at a position with respect to the valence and conduction bands that is different than the position of the fermi level in the bulk of the material. The different positions are illustrated in FIGS. 1 to 3.

Figure 1:
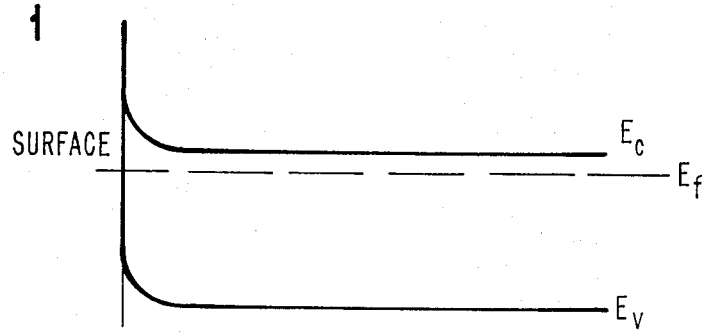
FIGS. 1 to 3 are energy level diagrams of the location of the fermi level at a surface for various materials.

Referring to FIG. 1, the conditions are such that the fermi level is pinned in the forbidden region. This type of situation is encountered in the material GaAs.

Figure 2:
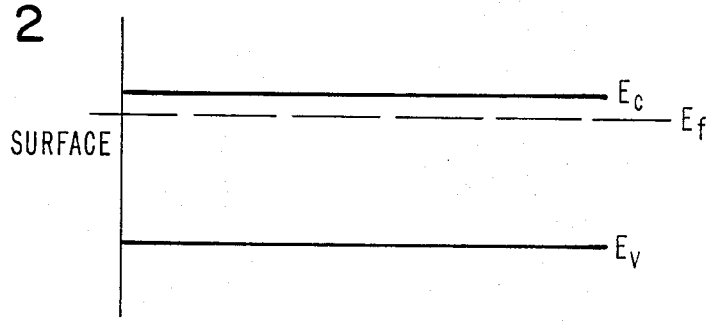

Referring next to FIG. 2, the fermi level is essentially unpinned or unaffected by the nature of the surface of the material. This type of situation is encountered in some materials including the material CdSe.

Figure 3:
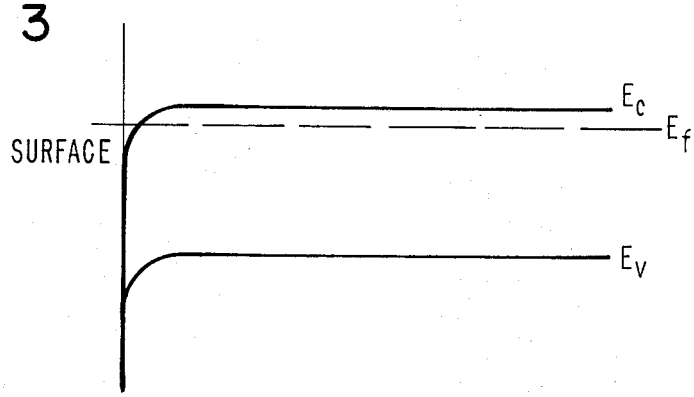

Referring next to FIG. 3, the fermi level is pinned in the conduction band. This type of situation is encountered in the material InAs. In accordance with the invention, the phenomenon of surface level pinning can be constructively employed in devices to tailor relative barrier heights and to relax conductivity requirements and in turn thereby to reduce bias levels, improve speed and power dissipation in devices.

Surface level pinning means that the location of the fermi level at the crystal surface with respect to a band edge is roughly constant and independent of the bulk fermi energy level position.

Figure 4:
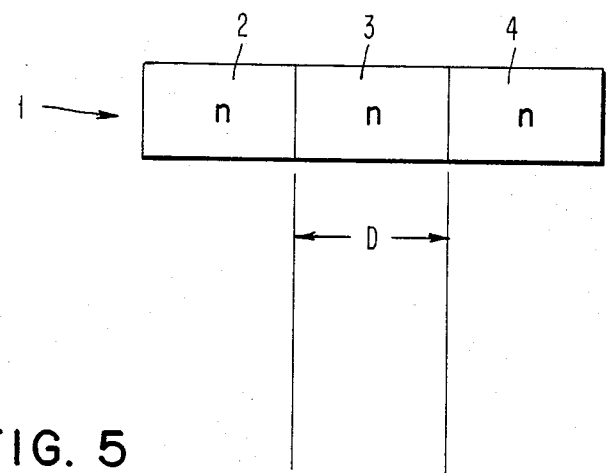
FIG. 4 is an illustration of the semiconductor structure of the invention.
Figure 5:
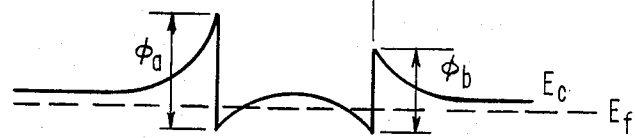
FIG. 5 is an energy level diagram dimensionally correlated with FIG. 4 showing the band energy variation at interfaces in FIG. 4 under the condition of no bias.

Referring to FIGS. 4 and 5, the overall structure is a three-layer monocrystalline body 1 having essentially coplanar regions 2, 3 and 4. The thickness D of the center or base region 3 is of the order of the mean free path of an electron. All regions are of the same conductivity type for majority carrier transport. The designation n is used to indicate these conditions. Dimensionally correlated with FIG. 4, in FIG. 5 there is provided an energy level diagram showing the variation in energy level in the regions 2, 3 and 4 and at the interfaces.

Referring next to FIG. 5, the conduction band level rises at the interface between the emitter 2 and the base 3 regions and then falls below the fermi level at the interface in the base 3. The difference is the emitter barrier labelled $\phi_a$.

Similarly, at the base 3 to collector 4 interface, the conduction band varies from below the fermi level to a level in the forbidden region. The energy gap of the region 4 is selected so that the barrier at the interface between the base 3 and collector 4, labelled $\phi_b$, is lower than $\phi_a$.

These conditions will occur when the materials of the regions 2, 3 and 4 are selected to provide the proper interface state density to produce surface fermi level pinning at the interfaces. The interface state density that results in surface fermi level pinning may be produced by such interface phenomena as misfit dislocations, contamination or ion beam damage. Many of the phenomena producing surface fermi level pinning may be controllably introduced.

In FIGS. 4 and 5, a lattice mismatch is employed between wider but different bandgap external regions 2 and 4 and the central region 3 so that misfit dislocations will form at the semiconductor interfaces and will pin the semiconductor fermi levels at the interfaces as shown in FIG. 5.

In the structure of the invention, the barriers and the barrier heights are precisely controlled by the nature of the surfaces of the semiconductor material employed so that precise reproducibility is achieved. Minimum external bias is involved since there are no internal barriers detrimental to conduction. The fermi level pinning in the central region 3 will create a two-dimensional electron gas layer in the base region 3 that will allow low resistance contact to be made to the base layer which in turn will reduce the base spreading resistance limitation well known in semiconductor transistor type devices.

BEST MODE FOR CARRYING OUT THE INVENTION

In accordance with the invention, referring to FIG. 4, the criteria of the invention may be met when the region 2 is made of GaAs doped n type with Si to a level of $10^{16}$ atoms per cc, the region 3 has a D dimension of 100 to 500 Angstroms and is made of InAs doped n type with Si to a level of $10^{16}$ atoms per cc. The dimension D is chosen to minimize quantum mechanical reflections at the barrier between regions 3 and 4 and is of the order of the mean free path length of a carrier in the particular material. Region 4 is made of $Ga_{(0.5x)}In_{(1-0.5x)}As$ doped n type with Si to a level of $10^{16}$ atoms per cc. The GaInAs composition, that is the value of x in $Ga_xIn_{1-x}As$, is chosen with respect to the materials of the other regions to optimize the barrier height $\phi_b$ between regions 3 and 4, to minimize quantum mechanical reflections and to maximize the current gain for the device.

Single crystal W may be substituted in region 3 for InAs.

The structure of the invention may be made by the standard technique in the art of molecular beam epitaxy wherein the transition from the GaAs region 2 to the InAs region 3 should occur over a distance of about 5 Angstroms and similarly the transition from the InAs region 3 to the GaInAs region 4 should be of about the same order. The barrier $\phi_a$ at the interface between the regions 2 and 3 should be of the order of 0.7 electron volts (Ev). The barrier $\phi_b$ between the regions 3 and 4 should be of the order of 0.5 Ev.

What has been described is a ballistic transport type semiconductor device wherein there is high switching speed and high conductivity with a built-in difference in barrier height.

Having thus described our invention, what we claim as new and desire to secure by Letters Patent is:

1. A monocrystalline three coplanar region transistor device comprising in combination
a central monocrystalline base region having a high particular extrinsic conductivity
   positioned between emitter and collector external coplanar region interfaces,
   said central region having a distance between said interfaces of the order of the mean free path of an electron in the material of said base region,
a first emitter external region of a first semiconductor material of said particular extrinsic conductivity type,
   forming a heterojunction with said base region at said emitter interface,
   said first semiconductor material having the Fermi level thereof pinned in the forbidden region at a value with respect to the conduction band level thereof to produce a first barrier height at said emitter interface, and
a second collector external region of a second semiconductor material of said particular extrinsic conductivity type,
   forming a heterojunction with said base region at said collector interface,
   said second semiconductor material having the Fermi level thereof pinned in the forbidden region at a value with respect to the conduction band level thereof to produce a second barrier height less than said first barrier height at said collector interface.

2. The transistor of claim 1 wherein said emitter region is GaAs, said base region is InAs and said collector region in GaInAs.

3. In a transistor of the type wherein conduction is by ballistic transport of majority carriers injected at an emitter barrier across a base region to a collector barrier, the improvement comprising
a monocrystalline high extrinsic conductivity semiconductor base region formed of InAs,
   having first and second essentially parallel, essentially planar faces,
      separated by a dimension of the order of the mean free path of a carrier and
      having the surface Fermi level thereof pinned in the conduction band,
an emitter region of monocrystalline GaAs epitaxially contiguous with said first face of said base region
   having a lattice mismatch with respect to said base material operable to produce a first barrier to carrier flow of a first height, and
a collector region of GaInAs
   epitaxially contiguous with said base region at said second interface and
   having a lattice mismatch with respect to said base material operable to produce a second barrier of a second height less than said first height.

4. The transistor of claim 3 wherein said emitter, base and collector are doped to $10^{16}$ with Si, and said base width is 100 to 500 Å.

* * * * *